US009739815B2

(12) United States Patent
Schwarzkopf

(10) Patent No.: US 9,739,815 B2
(45) Date of Patent: Aug. 22, 2017

(54) METHOD FOR DETERMINING THE ROTOR POSITION OF AN ELECTRICALLY-COMMUTED MULTI-PHASE DIRECT CURRENT MOTOR

(71) Applicant: Brose Fahrzeugteile GmbH & Co. Kommanditgesellschaft, Wuerzburg (DE)

(72) Inventor: Johannes Schwarzkopf, Marktheidenfeld (DE)

(73) Assignee: BROSE FAHRZEUGTEILE GMBH & CO. KOMMANDITSELLSCHAFT, WURZBURG, Wurzburg (DE)

( * ) Notice: Subject to any disclaimer, the term of this patent is extended or adjusted under 35 U.S.C. 154(b) by 375 days.

(21) Appl. No.: 14/415,640

(22) PCT Filed: Jul. 11, 2013

(86) PCT No.: PCT/EP2013/002049
§ 371 (c)(1),
(2) Date: Jan. 19, 2015

(87) PCT Pub. No.: WO2014/012637
PCT Pub. Date: Jan. 23, 2014

(65) Prior Publication Data
US 2015/0177297 A1    Jun. 25, 2015

(30) Foreign Application Priority Data
Jul. 20, 2012   (DE) .......................... 10 2012 212 766

(51) Int. Cl.
*H02P 7/29*       (2016.01)
*G01R 25/00*      (2006.01)
(Continued)

(52) U.S. Cl.
CPC ............... *G01R 25/00* (2013.01); *G01D 5/14* (2013.01); *H02P 6/182* (2013.01); *H02P 6/185* (2013.01)

(58) Field of Classification Search
USPC .................... 388/811; 318/400.33, 720, 807
See application file for complete search history.

(56) References Cited

U.S. PATENT DOCUMENTS 5,510,689 A  *  4/1996  Lipo ........................ H02P 6/187
                                                       318/807
7,138,776 B1 * 11/2006 Gauthier ................... H02P 6/10
                                                       318/400.34
(Continued)

FOREIGN PATENT DOCUMENTS

AT         395 487 B      1/1993
DE       100 56 879 C1   11/2002

OTHER PUBLICATIONS

International Search Report and Written Opinion for PCT Application No. PCT/EP2013/002049, dated May 13, 2014, 9 pages.
(Continued)

*Primary Examiner* — Lam Nguyen
(74) *Attorney, Agent, or Firm* — Westman, Champlin & Koehler, P.A.

(57) ABSTRACT

The invention relates to a generic method for determining the rotor position of an electronically-commutated multi-phase direct current motor, characterized in: (a) generating of a plurality of test voltage pulses in the winding system with a specified switch-on duration $\Delta T$ by means of the commuting device in different phase distributed over 360°; (b) measurement of the current values of the current responses of the test voltage pulses on expiration of the switch-on period of the respective test voltage pulse; (c) approximation of the measured current values by means of a periodic approximation function from a superimposition of (Continued)

Figure 1:
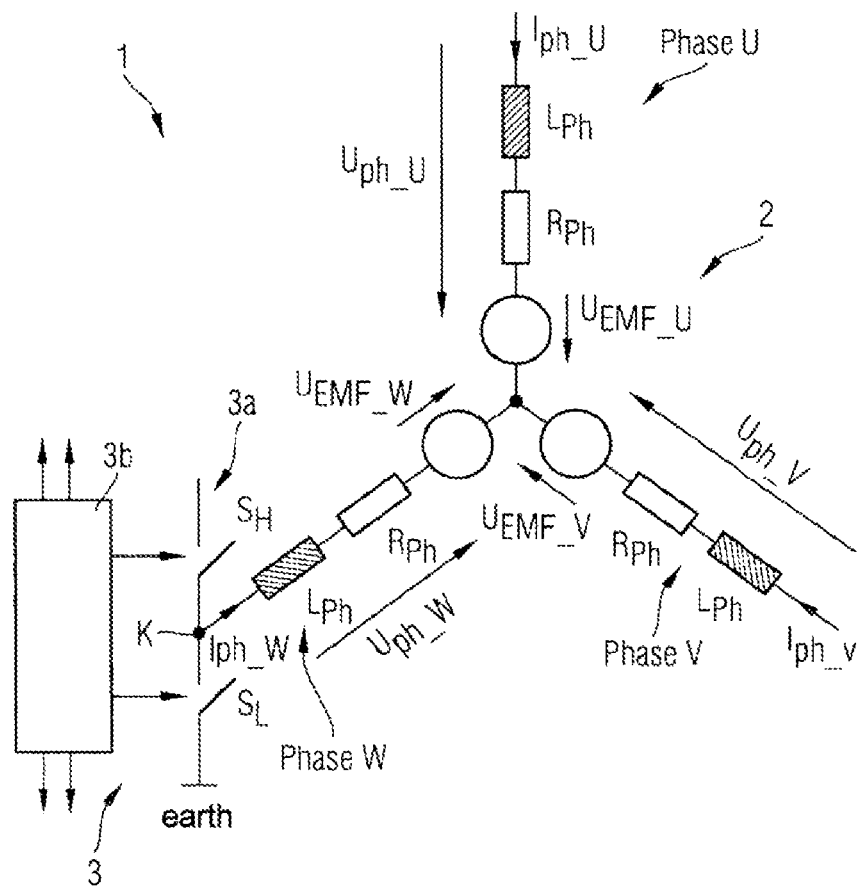

a preferably sinusoidal fundamental wave with an amplitude IEMK and the associated first harmonic with an amplitude Und as a factor of the phase of the test voltage pulse, wherein the sinusoidal fundamental wave follows the chronological progression of the counter EMF voltage of the stator and the first harmonic follows the chronological progression of the stator of the direct current motor; (d) determination of an amplitude ratio value $I_{EMF}/I_{Ind}$ of the fundamental wave and the first harmonic of the approximation function; (e) determination of the rotor position as the EMF angle from the argument of the first harmonic of the approximation function as a factor of the amplitude ratio $I_{EMF}/I_{Ind}$, wherein the EMF angle indicates the phase offset of the sinusoidal progression of the counter EMF voltage of the stator relative to the approximation function and the inductivity angle indicates the phase offset of the sinusoidal progression of the inductivity of the stator relative to the approximation function.

11 Claims, 2 Drawing Sheets

(51) Int. Cl.
  *H02P 6/182* (2016.01)
  *H02P 6/185* (2016.01)
  *G01D 5/14* (2006.01)

(56) References Cited

U.S. PATENT DOCUMENTS

| | | | |
|---|---|---|---|
| 7,443,130 B2 * | 10/2008 | Takao | H02P 21/14 |
| | | | 318/720 |
| 2007/0031131 A1 * | 2/2007 | Griffitts | H02P 6/18 |
| | | | 388/811 |
| 2010/0141192 A1 | 6/2010 | Paintz et al. | |

OTHER PUBLICATIONS

German Search Report for German Patent Application No. 10 2012 212 766.6, dated Aug. 7, 2012, 5 pages.

* cited by examiner

# US 9,739,815 B2

METHOD FOR DETERMINING THE ROTOR POSITION OF AN ELECTRICALLY-COMMUTED MULTI-PHASE DIRECT CURRENT MOTOR

CROSS-REFERENCE TO RELATED APPLICATION

This Application is a Section 371 National Stage Application of International Application No. PCT/EP2013/002049, filed 11 Jul. 2013 and published as WO 2014/012637 A2 on 23 Jan. 2014, in German, the contents of which are hereby incorporated by reference in their entirety.

FIELD OF THE INVENTION

The invention relates to a method for determining the rotor position of an electronically commutated multiphase DC motor having a pole count $\geq 2$ and a multiphase winding system, and having a commutation device for producing phase voltages in the winding system, said DC motor comprising a rotor and a stator.

TECHNICAL BACKGROUND

Such electronically commutated DC motors (BLDC motors or EC motors) are generally known and comprise as the rotor a permanent magnet, for example, which is driven by a rotating excitation field. This excitation field is produced, for example, by a three-phase winding system configured in a star-connection or delta-connection using trapezoidal or sinusoidal current waveforms, which are phase-offset with respect to one another, to energise the winding phases thereof.

Commutation of a BLDC motor is typically performed on the basis of microprocessor- or software-based open-loop or closed-loop control of the individual phase currents of the windings of the winding system of the BLDC motor by using in a known manner, for instance, a triple half-bridge consisting of power switches, for example MOSFETs, to generate a plurality of currents through the winding system that differ in phase position and amplitude. The power semiconductors are controlled by a microprocessor, which needs to know the rotor position of the rotor in order to determine the optimum commutation times. The rotor position can be ascertained without sensors or using an additional sensor system.

Various methods are known for ascertaining without sensors the rotor position of the rotor of a BLDC motor. In a first group of methods, the current rotor position is ascertained by analysing the zero crossovers of the induced back voltage (EMF) in the winding phases that are not currently energised, because a voltage vector induced in the winding system is uniquely associated with the rotor position. This analysis assumes that the rotor is stationary, however.

Although such a method can also be used when the rotor is rotating very slowly, the errors in the ascertained rotor position increase as the rotational speed increases.

A second group of methods is based on the variation of the inductance of the BLDC motor. As a permanent magnet, the rotor produces a magnetic asymmetry because the reluctance is greater in the direction of the magnetisation of the rotor (d-axis) than in the transverse direction (q-axis). This results in an inductance of the BLDC motor that is dependent on the rotor position. That stator winding phase for which the magnetic axis is coincident with the d-axis of the rotor has a minimum inductance, and that winding phase for which the magnetic axis is coincident with the q-axis, i.e. rotated through 90°, has a maximum inductance. In the non-energised state of the BLDC motor, the south pole and the north pole of the rotor as a permanent magnet have the same effect and hence the characteristic of this variable inductance has twice the periodicity of the electrical variables. This 180° ambiguity must be resolved for complete position information. To do this, a voltage signal is applied according to the direction of the rotor so as to reduce or raise the saturation in the stator, i.e. decrease or increase the corresponding inductance, in order to be able to determine the rotor position therefrom.

Document AT 395 487 B, for example, discloses this inductive approach to determining the rotor position, in which the current pulses, generated by voltage pulses, and associated voltage pulses are detected and the resultant inductances are determined. These inductance values are assigned to a sinusoidal characteristic around the circumference in order to ascertain therefrom the current position within the sinusoidal characteristic. According to this known method, a second measurement must be performed in order to be able to compensate for the EMF voltage arising in the measurement result when the rotor is rotating.

SUMMARY OF THE INVENTION

The object of the invention is to define a method of the type mentioned at the outset which can be used to determine with high certainty the rotor position of a BLDC motor in all operating states.

The invention proposes a method having the features of claim 1.

Said claim provides:

A method for determining the rotor position of an electronically commutated multiphase DC motor having a pole count $\geq 2$ and a multiphase winding system, and having a commutation device for producing phase voltages in the winding system, said DC motor comprising a rotor and a stator. The method according to the invention is characterised by the following method steps: (a) generating in the winding system by means of the commutation device a plurality of test voltage pulses having predetermined on-period $\Delta T$ in different phase positions distributed over 360°; (b) measuring the current values of the current responses to the test voltage pulses at the end of the on-period of the respective test voltage pulses; (c) approximating the measured current values by a periodic approximation function composed of a superposition of a fundamental wave having an amplitude $I_{EMF}$ and the associated first harmonic having an amplitude $I_{Ind}$ as a function of the phase position of the test voltage pulses, wherein the sinusoidal fundamental wave models the variation over time of the back EMF voltage of the stator, and the first harmonic models the variation over time of the inductance of the stator of the DC motor; (d) determining an amplitude ratio value $I_{EMF}/I_{Ind}$ of the amplitudes $I_{EMF}$ and $I_{Ind}$ of the fundamental wave and the first harmonic of the approximation function; (e) determining the rotor position as an EMF angle from the fundamental-wave argument of the approximation function and/or as an inductance angle from the first-harmonic argument of the approximation function according to the amplitude ratio $I_{EMF}/I_{Ind}$, wherein the EMF angle gives the phase offset of the sinusoidal characteristic of the back EMF voltage of the stator with respect to the approximation function, and the inductance angle gives the phase offset of the sinusoidal characteristic of the inductance of the stator with respect to the approximation function.

The present invention is based on the knowledge that the EMF is dependent, inter alia, on the speed and position of the rotor. The idea of the present invention then consists in viewing this EMF not as an interference quantity but as an information quantity.

Thus in this method according to the invention, both the EMF voltage and the variable inductance produced as a result of the magnetic asymmetry of the rotor are advantageously used as the wanted signal for determining the rotor position of the rotor. In particular for rotational speeds at which the effects of EMF and of the magnetic asymmetry on the measured current values are approximately equally large, using the method according to the invention increases the reliability of determining the rotor position correctly and the accuracy of the determined rotor position.

It should be mentioned that analysing the effect of the inductance and analysing the effect of the EMF are known per se. In such known solutions, however, only one of the two effects is ever considered or an attempt is made to eliminate or minimise the effect of the second effect. Unlike these solutions, in the present invention both effects contribute to ascertaining the position, and are hence ascertained.

Advantageous embodiments and developments appear in the subclaims and in the description with reference to the figures in the drawings.

In an advantageous embodiment of the invention, for a large value A of the amplitude ratio $I_{EMF}/I_{Ind}$ where $A \geq a_1 \gg 1$, the EMF angle is determined as the rotor position of the rotor. This large amplitude ratio signifies a high rotational speed of the DC motor, at which the effect of the EMF voltage dominates and hence the effect of the varying inductance of the motor caused by the magnetic asymmetry of the rotor is negligible. The rotor position of the rotor can be determined simply and directly from the fundamental-wave argument.

In a further embodiment of the invention, for a small value A of the amplitude ratio $I_{EMF}/I_{Ind}$ where $A \leq a_2 \ll 1$, the inductance angle is determined as the direction of the rotor with a 180° ambiguity. This small value of the amplitude ratio occurs when the rotor is stationary or rotating slowly, and therefore no EMF voltage or only a low-value EMF voltage occurs, with the result that the corresponding amplitude of the fundamental wave of the approximation function is negligible, and hence the direction of the rotor can be determined simply from the first-harmonic argument. To remove the 180° ambiguity, a further measurement is performed in a known manner by applying a voltage signal according to the direction of the rotor so as to reduce or raise the saturation in the stator, i.e. decrease or increase the corresponding inductance, in order to be able to determine the rotor position therefrom.

A high degree of robustness of the method according to the invention is achieved in a particularly preferred development of the invention if for a value A of the amplitude ratio $I_{EMF}/I_{Ind}$, where $a_2 < A < a_1$, and $a_2 \ll 1$ and $a_1 \gg 1$, the rotor position of the rotor is determined from the EMF angle and/or the inductance angle. Such an amplitude ratio corresponds to operating states of the motor in which both the EMF voltage and the varying inductance of the motor caused by magnetic asymmetry of the rotor have appreciable an effect on the measured current values.

It is advantageous here according to one embodiment if a value for the rotor position of the rotor is determined from the weighted values of the EMF angle and the inductance angle, wherein the weighting is performed according to the values of the EMF angle and the inductance angle. The weighting can also be performed in a fixed ratio. This achieves a high accuracy for the rotor angle being sought.

In addition, it is particularly advantageous if, according to a development, the motor-specific phase difference between the EMF angle and the inductance angle is determined, and the value for the phase difference is used to check the plausibility of the values for the rotor position of the rotor that are determined from the EMF angle and/or the inductance angle. This phase difference between EMF angle and the inductance angle is a constant value for every motor and can be ascertained and usually equals either $+\pi/4$ or $-\pi/4$. This value is then used as an indicator for the measurement error in the EMF angle and/or the inductance angle.

According to a further embodiment of the invention, for a value A of the amplitude ratio $I_{EMF}/I_{Ind}$, where $a_2 < A < a_1$, and a2 1 and a1 1, the value of the absolute minimum of the approximation function is used as the rotor position of the rotor if the motor-specific phase difference between the EMF angle and the inductance angle is ascertained to be $+\pi/4$. On the other hand, for a phase difference of $-\pi/4$, the value of the absolute minimum of the approximation function is used as the rotor position of the rotor according to a development. This means that a rapid graphical analysis of the approximation function is also possible in additional to an analytical analysis.

In a further advantageous embodiment of the invention, the inductance angle in the first-harmonic approximation function is substituted by a subtraction operation between the EMF angle and the inductance angle using a difference value ascertained for a specific motor. A better approximation performance is achieved using an approximation function expanded in this manner, resulting in a higher and more reliable determination of the rotor position of the rotor.

According to a development, from this expanded approximation function, the EMF angle representing the rotor position of the rotor is simply and directly obtained from the fundamental-wave argument and the first-harmonic argument.

In a particularly preferred embodiment, the approximation function is formed from a superposition of a sinusoidal fundamental wave, having the amplitude, and the associated first harmonic, having an amplitude, as a function of the phase position αs of the test voltage pulses. The sine function is preferably selected. The approximation function can differ from this, however, for instance if the EMF or the variation in the inductance is not sinusoidal The above embodiments and developments can be combined with one another in any practical way. Further possible embodiments, developments and implementations of the invention also include combinations of features of the invention that are described above or below with regard to embodiments, even if these combinations are not mentioned explicitly. In particular, a person skilled in the art will here also add individual aspects as improvements or additions to the relevant basic form of the present invention.

CONTENTS OF THE DRAWINGS

Figure 2:
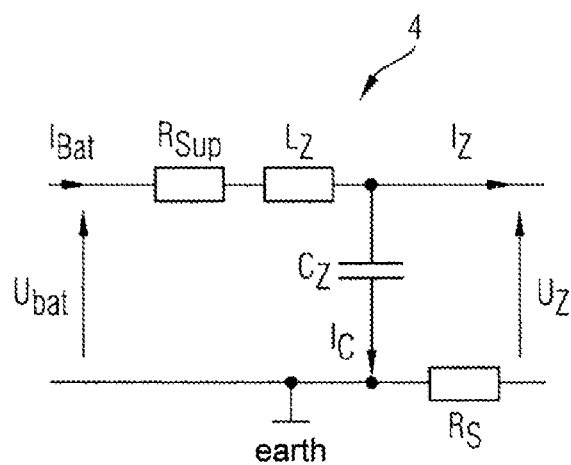
Figure 3:
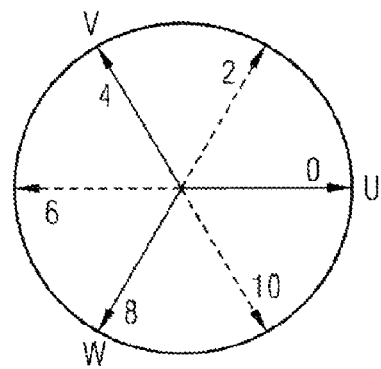
Figure 4:
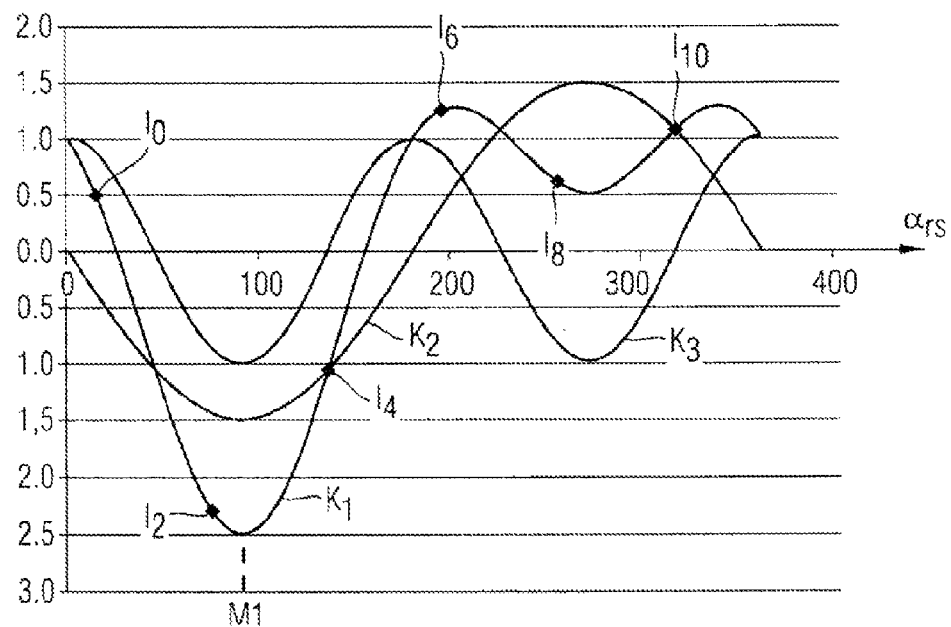

The present invention is described in greater detail below with reference to the embodiments presented in the schematic figures of the drawings, in which:

FIG. 1 is a circuit diagram comprising the equivalent circuit of the winding system of a BLDC motor and comprising a half-bridge and a commutation device, for the purpose of explaining the method according to the invention, FIG. 2 is a circuit diagram of an intermediate circuit for the voltage supply to the winding system of the BLDC motor according to FIG. 1, FIG. 3 is a voltage space vector diagram for representing test voltage pulses according to the method according to the invention, and FIG. 4 is a graph containing the current characteristics corresponding to the approximation function and to the fundamental wave thereof and to the first harmonic as a function of the rotor angle.

The accompanying drawings are intended to provide greater understanding of the embodiments of the invention. They illustrate embodiments and are used in conjunction with the description to explain principles and concepts of the invention. Other embodiments and many of the stated advantages are apparent from the drawings. The elements of the drawings are not necessarily shown to scale.

In the figures, elements that are identical and have the same function and effect are denoted by the same reference signs unless otherwise stated.

DESCRIPTION OF EMBODIMENTS

FIG. 1 shows a circuit diagram comprising the equivalent circuit of the winding system of a BLDC motor and comprising a half-bridge and a commutation device, for the purpose of explaining the method according to the invention.

As shown in FIG. 1, a 3-phase brushless DC motor (BLDC motor) 1 having a pole count of 2, represented as a winding system 2 having star-connected U-, V- and W-phases, is driven by a commutation device 3. Each of the phases U, V and W is controlled by a half-bridge, although FIG. 1 shows only one half-bridge 3a for the phase W. These half-bridges for the phases U, V and W together with a control unit, for example a microprocessor 3b, form the commutation device 3.

Each of the phases U, V and W comprises a winding inductance $L_{Ph}$, a winding resistance $R_{Ph}$ and a voltage source $U_{EMF\_U}$, $U_{EMF\_V}$ and $U_{EMF\_W}$ respectively representing the back EMF.

The half-bridge 3a for the phase W and hence the half-bridges for the other phases U and V are composed, in a known manner, of MOSFETs as transistor switches $S_H$ and $S_L$ and each comprise freewheeling diodes (not shown). As shown in FIG. 1, the phase W is connected to a phase contact K of the half-bridge 3a, correspondingly also the other phases V and W to phase contacts of the associated half-bridges.

The half-bridge 3a and the other half-bridges are connected to an intermediate-circuit voltage $U_Z$, with the result that the high-side MOSFET $S_H$ lies at the potential of the intermediate-circuit voltage $U_Z$ and the low-side MOSFET $S_L$ lies at the reference potential Ground.

The intermediate-circuit voltage $U_Z$ is generated as shown in FIG. 2 by an intermediate circuit connected to a battery voltage $U_{bat}$, which circuit comprises a supply resistor $R_{sup}$ and an intermediate-circuit inductor $L_Z$ in a longitudinal arm, and a shunt resistor $R_s$ in a parallel longitudinal arm lying at a reference potential Ground. An intermediate-circuit capacitor $C_z$ connects the two longitudinal arms.

Depending on the switching states of the transistor switches of the half-bridges, each phase U, V and W is applied either to the potential of the intermediate-circuit voltage $U_z$ or to the reference potential Ground, thereby generating a phase voltage $U_{Ph\_U}$, $U_{Ph\_V}$ and $U_{Ph\_W}$ respectively that results in a phase current $I_{Ph\_U}$, $I_{Ph\_V}$ and $I_{Ph\_W}$ respectively.

The half-bridge 3a for the phase U, and the respective half-bridges for the phases V and W, can assume the following states independently of one another:

High state:
  The high-side MOSFET $S_H$ is active. The intermediate-circuit voltage is applied to the phase U, V and W respectively.
Low state:
  The low-side MOSFET $S_L$ is active. The reference potential GND is applied to the phase U, V and W respectively.
Tristate state:
  Both MOSFETs $S_H$ and $S_L$ are inactive. Owing to the winding inductances $L_{Ph}$, current can flow through the freewheeling diodes of the MOSFETs. The EMF voltage $U_{EMF\_U}$, $U_{EMF\_V}$ and $U_{EMF\_W}$ respectively is generated in the phases U, V, W.

In order to determine the rotor position of the rotor of the BLDC motor 1, the different inductance thereof in the direction of the d-axis and of the q-axis perpendicular thereto of the rotor is used, this variable inductance originating from the magnetic asymmetry of the rotor of the BLDC motor 1, which rotor is in the form of a bar magnet.

When the rotor is rotating in the stator of the BLDC motor 1, a back EMF voltage $U_{EMF}$ is generated in the phases U, V and W. The inductance varies at twice the frequency of the characteristic of the back EMF voltage $U_{EMF}$. The measurement and analysis carried out to determine the rotor position also take into account the back EMF voltage in addition to the variable inductance. To do this, test voltage pulses are generated in the winding system 2 of the BLDC motor 1, the current responses of which are measured as current values and analysed to determine the rotor position of the rotor of the BLDC motor 1

These test voltage pulses are generated by appropriate control of the half-bridge 3a for the phase W and of the half-bridges for the phases U and V of the commutation device 3.

Twelve control options exist for the half-bridges, by means of which current can be driven into the winding system 2 of the BLDC motor 1. The twelve control options result in voltage vectors, the directions of which in the winding system 2 of the BLDC motor 1 are rotated through 30° at a time and are listed in the following table.

| No. | Phase U | Phase V | Phase W | $\alpha_s$ [°] |
| --- | --- | --- | --- | --- |
| 0 | Low | High | High | 0 |
| 1 | Low | Tristate | High | ~30 |
| 2 | Low | Low | High | 60 |
| 3 | Tristate | Low | High | ~90 |
| 4 | High | Low | High | 120 |
| 5 | High | Low | Tristate | ~150 |
| 6 | High | Low | Low | 180 |
| 7 | High | Tristate | Low | ~210 |
| 8 | High | High | Low | 240 |
| 9 | Tristate | High | Low | ~270 |
| 10 | Low | High | Low | 300 |
| 11 | Low | High | Tristate | ~330 |

These voltage vectors are numbered from 0 to 11, wherein the voltage vector numbered 0 defines a vector in the direction of the phase U. The other voltage vectors numbered 1 to 11 are rotated through the angle $\alpha_s$ with respect to the voltage vector numbered 0.

In accordance with the control pattern in the table, the voltage vector numbered 0 and the even-numbered voltage vectors are generated as test voltage vectors denoted by $V_0$, $V_2$, $V_4$, $V_6$, $V_8$ and $V_{10}$, which are shown in the space vector diagram of FIG. 3.

The voltage vectors numbered 1, 3, 5, 7, 9 and 11 in the table are produced by a phase for which the half-bridge has the tristate state. As a result of the induced voltage and the freewheeling current produced thereby, the direction of these voltage vectors can differ from the theoretical direction, which is why only approximate angle values are given in the table as the angle $\alpha_s$ of these voltage vectors.

In accordance with the control pattern in the table, the commutation device 3 is used to generate the test voltage pulses $V_0$, $V_2$, $V_4$, $V_6$, $V_8$ and $V_{10}$ in the winding system 2 of the BLDC motor 1 having a predetermined on-period $\Delta T$.

The current responses are measured as current values $I_0$, $I_2$, $I_4$, $I_6$, $I_8$ and $I_{10}$ on the basis of the test voltage pulses $V_0$, $V_2$, $V_4$, $V_6$, $V_8$ and $V_{10}$, and constitute the change $\Delta I(\alpha_s)$ in the intermediate-circuit current $I_Z$ at the end of the on-period $\Delta T$, where $\alpha_s = 0°$, $60°$, $120°$, $180°$, $240°$ and $300°$. The angle $\alpha_s$ characterises the dependency of the current value $\Delta I(\alpha_s)$ on the test voltage pulses $V_0$, $V_2$, $V_4$, $V_6$, $V_8$ and $V_{10}$. The term $I(\alpha_s)$ is used below for the term $\Delta I(\alpha_s)$.

Six current values $I(\alpha_s)$, where $\alpha_s = 0°$, $60°$, $120°$, $180°$, $240°$ and $300°$, have been ascertained on the basis of the n=6 test voltage pulses $V_0$, $V_2$, $V_4$, $V_6$, $V_8$ and $V_{10}$ and are plotted in the graph of FIG. 4 as measured values $I_0$, $I_2$, $I_4$, $I_6$, $I_8$ and $I_{10}$ against the angle $\alpha_{rs}$ between the voltage vector of the stator and the rotor position of the rotor of the BLDC motor 1. The level of these measured values is mainly dependent on the variable inductance and the induced back EMF voltage.

These measured values are now approximated by a periodic approximation function $I(\alpha_s)$, which is composed of sine functions, wherein the EMF voltage is reproduced in a fundamental wave, and the effect of the variable inductance is approximated by twice the frequency of the fundamental wave. The following approximation function is obtained by approximating the measured values by a DC component $I_0$, a fundamental wave and a first harmonic:

$$I(\alpha_s) = I_0 + I_{EMF} * \sin(\alpha_s - \alpha_{EMF}) + I_{Ind} * \sin(2*(\alpha_s - \alpha_{Ind})) \quad (1)$$

where
$I_{EMF} \geq 0$;
$I_{Ind} \geq 0$
$0 \leq \alpha_{EMF} \leq 2\pi$
$0 \leq \alpha_{Ind} \leq 2\pi$, where $I_0$ is a DC component, $\alpha_s$ is the angle between the test voltage vector $V_0$ and the respective other test voltage vectors $V_2$, $V_4$, $V_6$, $V_8$ and $V_{10}$, $I_{EMF}$ and $I_{Ind}$ are the maximum amplitudes respectively of the back EMF voltage and of the variable inductance, and $\alpha_{EMF}$ and $\alpha_{Ind}$ define the phase offset of the sinusoidal characteristic of the back EMF voltage and the phase offset of the sinusoidal characteristic of the stator inductance, respectively, with respect to the approximation function $I(\alpha_s)$, and are referred to below as the EMF angle $\alpha_{EMF}$ and inductance angle $\alpha_{Ind}$ respectively.

The graph in FIG. 4 shows the characteristic of the approximation function $I(\alpha s)$ as a curve $K_1$ and the sinusoidal characteristic of the back EMF voltage as a fundamental wave, offset by the angle $\alpha_{EMF}$ with respect to the curve $K_1$ and denoted by $K_2$, and the characteristic of the first harmonic which models the inductance and is offset by the angle $\alpha_{Ind}$ with respect to the curve $K_1$ and denoted by $K_3$. The DC component $I_0$ is not shown in FIG. 4.

Owing to the variable inductance having twice the frequency of the characteristic of the back EMF voltage, $\alpha_{Ind}$ assumes the same value for every increase or decrease by the value $\pi$. Therefore $\alpha_{Ind}$ indicates only the direction of the d-axis of the rotor of the BLDC motor 1, but the sign is not initially explicit (180° ambiguity).

The approximation function $I(\alpha_s)$ is now analysed on the basis of different operating states of the BLDC motor 1, which are reflected in different amplitudes $I_{EMF}$ and $I_{Ind}$ respectively of the fundamental wave and of the first harmonic of the approximation function $I(\alpha_s)$. The amplitude ratio value $I_{EMF}/I_{Ind}$ of the amplitudes $I_{EMF}$ and $I_{Ind}$ is therefore considered.

In the case of $I_{EMF} \gg I_{Ind}$, the BLDC motor 1 rotates very fast, and therefore the effect of the back EMF voltage on the measured current values is very large and dominates compared with the variable inductance. Hence for the value A of the amplitude ratio value $I_{EMF}/I_{Ind}$ it holds that: $A \geq a_1$ where $a_1 \gg 1$, where $a_1$ is selected as a constant specifically for the motor.

Hence the component of the first harmonic is negligible in the approximation function $I(\alpha_s)$, and the rotor angle of the rotor of the BLDC motor 1 can be determined directly from the value of the EMF angle $\alpha_{EMF}$.

In the case of $I_{EMF} \ll I_{Ind}$, the BLDC motor 1 is stationary or its rotor is rotating very slowly. Therefore the effect of the back EMF voltage on the measured current values is negligible. Hence for the value A of the amplitude ratio value $I_{EMF}/I_{Ind}$ it holds that: $A \leq a_2$ where $a_2 \ll 1$, where $a_2$ is selected as a constant specifically for the motor.

Hence the component of the fundamental wave is negligible in the approximation function $I(\alpha_s)$ and the orientation of the rotor of the BLDC motor 1 can be determined, except for the 180° ambiguity, from the value of inductance angle $\alpha_{Ind}$. The 180° decision must be determined by a further measurement by, for example, applying a voltage signal according to the direction of the rotor so as to reduce or raise the saturation in the stator, i.e. decrease or increase the corresponding inductance, in order to be able to determine the rotor position therefrom.

If the BLDC motor 1 is rotating at a speed at which both the back EMF voltage and the variable inductance constitute significant components of the measured current values, then the following holds for the value A of the amplitude ratio value $I_{EMF}/I_{Ind}$: $a_2 < A < a_1$, where $a_2 \ll 1$ and $a_1 \gg 1$, and these constants $a_1$ and $a_2$ are selected specifically for the motor.

Hence the EMF angle $\alpha_{EMF}$ and the inductance angle $\alpha_{Ind}$ can be determined and analysed from the approximation function $I(\alpha_s)$, i.e. the rotor position of the rotor is determined from the EMF angle $\alpha_{EMF}$ and the inductance angle $\alpha_{Ind}$ or $\alpha_{Ind} \pi$ because of the 180° ambiguity. The 180° decision can be made using the EMF angle $\alpha_{EMF}$.

The rotor position of the rotor of the BLDC motor 1 can be determined by weighting these two values, where the weighting is performed according to the values of the EMF angle $\alpha_{EMF}$ and the inductance angle $\alpha_{Ind}$. The weighting can also be performed in a fixed ratio.

A further use of the two values for the EMF angle $\alpha_{EMF}$ and the inductance angle $\alpha_{Ind}$ is obtained by applying a known relationship between these two quantities, which has a constant value specifically for the motor, i.e. for each motor, according to the following formula:

$$\alpha_{EMF\_Ind} = \alpha_{EMF} - \alpha_{Ind}, \quad (2)$$

where $\alpha_{EMF}$ represents the EMF angle and $\alpha_{Ind}$ the inductance angle. The value of this angle $\alpha_{EMF\_Ind}$ often equals $T\pi/4$.

This relationship (2) can be used to check the plausibility of both values for the EMF angle $\alpha_{EMF}$ and the inductance angle $\alpha_{Ind}$ by using the value $\alpha_{EMF\_Ind}$ as an indicator for a measurement error. If the value $\alpha_{EMF\_Ind}$ differs too sharply from the difference between the two values of the EMF angle $\alpha_{EMF}$ and the inductance angle $\alpha_{Ind}$, then the measurements from which the values for the EMF angle $\alpha_{EMF}$ and the inductance angle $\alpha_{Ind}$ have been determined, are discarded.

A further analysis method results from using the relationship (2). If this angle $\alpha_{EMF\_Ind}$ has a value of $+\pi/4$, then a minimum of the first harmonic of the approximation function $I(\alpha_s)$, which first harmonic models the variable inductance, also exists where the back EMF voltage modelling the fundamental wave of the approximation function $I(\alpha_s)$ is at a minimum. Both components tend to reinforce this minimum with the result that it can be determined as the absolute minimum of the approximation function $I(\alpha_s)$. In the graph shown in FIG. 4, this absolute minimum is denoted by $M_1$. This minimum $M_1$ corresponds to the angle of the rotor position of the rotor of the BLDC motor 1.

If this angle $\alpha_{EMF\_Ind}$ has a value of $-\pi/4$ (or $3\pi/4$), then instead of the minimum, the absolute maximum of the approximation function $I(\alpha_s)$ must be ascertained to determine the rotor position of the rotor of the BLDC motor 1.

Finally, the relationship (2) can also be used to expand the approximation function $I(\alpha_s)$ given by (1), by substituting for the inductance angle $\alpha_{Ind}$ the expression $$\alpha_{Ind}=\alpha_{EMF}-\alpha_{EMF\_Ind}.$$

This results in the expanded approximation function $I(\alpha_s)$ given by the following formula and containing a known value for the angle $\alpha_{EMF\_Ind}$:

$$I(\alpha_s)=I_0+I_{EMF}*\sin(\alpha_s-\alpha_{EMF})+I_{Ind}*\sin(2*(\alpha_s-(\alpha_{EMF}-\alpha_{EMF\_Ind}))) \quad (3)$$

where the variables have the same meaning as those in the formula (1) and the relationship (2).

This expanded approximation function $I(\alpha_s)$ given by the relationship (3) is used to perform again an approximation of the measured current values $I_0$, $I_2$, $I_4$, $I_6$, $I_8$, and $I_{10}$ and to determine the EMF angle $\alpha_{EMF}$, which gives the rotor position of the rotor of the BLDC motor 1.

Although the present invention has been described fully above with reference to preferred embodiments, it is not restricted to these embodiments but can be modified in a variety of ways.

In the measurement and analysis methods described above, the current responses to a plurality of test voltage pulses are measured and analysed, wherein the intermediate-circuit voltage is constant while generating the test voltage pulses in the winding system of the BLDC motor 1 and measuring the current values. If this is not the case, voltage fluctuations in the intermediate circuit 4 must be taken into account in the analysis of the measured current values.

In the embodiment presented above, n=6 test voltage pulses are generated in order to measure therefrom using six current values the current responses of these test voltage pulses. Obviously fewer than six or more than six, in particular all the twelve voltage vectors listed in the table above (including those with a tristate state of the associated half-bridges), can also be used to generate the test voltage pulses.

In addition, in the embodiment shown above, the current responses to the test voltage pulses are measured as current values of the intermediate circuit 4, i.e. as intermediate-circuit currents. It is also possible to measure the phase currents instead of the intermediate-circuit currents. Three measured values for the phase currents $I_{ph\_U}$, $I_{ph\_V}$ and $I_{ph\_W}$ are then obtained for each of the test voltage pulses, only two measured values being independent. It is possible to convert the measured values obtained in this way into the intermediate-circuit currents or to expand the equations (1) and (3) accordingly.

In addition, the described method does not depend on whether the three-phase winding system of the BLDC motor 1 is connected in a star-configuration or delta-configuration.

Finally, it is obviously also possible to carry out the described method for determining the rotor position of an electronically commutated multiphase DC motor also for a pole count of more than 2 poles and having a winding system of the BLDC motor that has more than three winding phases.

Although the invention was always presented in the above embodiments with reference to six pulses, it should be mentioned that this constitutes just one (e.g. preferred) variant. It is a matter of course that the invention also works when there are more pulses or fewer pulses.

LIST OF REFERENCE NUMERALS

1 DC motor
2 winding system of the DC motor 1
3 commutation device
3a half-bridge
3b control unit, microprocessor
4 intermediate circuit

The invention claimed is:

1. The method for determining the rotor position of an electronically commutated multiphase DC motor having a pole count $\geq 2$ and a multiphase winding system, and having a commutation device for producing phase voltages in the winding system, said DC motor comprising a rotor and a stator, the method comprising the following steps:
  (a) generating in the winding system by means of the commutation device a plurality of test voltage pulses having a predetermined on-period $\Delta T$ in different phase positions distributed over 360°;
  (b) measuring the current values of the current responses to the test voltage pulses at the end of the on-period $\Delta T$ of the respective test voltage pulses;
  (c) approximating the measured current values by a periodic approximation function $I(\alpha_s)$ composed of a superposition of a fundamental wave having an amplitude $I_{EMF}$ and the associated first harmonic having an amplitude $I_{Ind}$ as a function of the phase position $\alpha_s$ of the test voltage pulses, the fundamental wave modelling the variation over time of the back EMF voltage of the stator, and the first harmonic modelling the variation over time of the inductance of the stator of the DC motor;
  (d) determining an amplitude ratio value $I_{EMF}/I_{Ind}$ of the amplitudes $I_{EMF}$ and $I_{Ind}$ of the fundamental wave and the first harmonic of the approximation function $I(\alpha_s)$;
  (e) determining the rotor position as an EMF angle $\alpha_{EMF}$ from the fundamental-wave argument of the approximation function $I(\alpha_s)$ and/or as an inductance angle $\alpha_{Ind}$ from the first-harmonic argument of the approximation function $I(\alpha_s)$ according to the amplitude ratio $I_{EMF}/I_{Ind}$, the EMF angle $\alpha_{EMF}$ giving the phase offset of the sinusoidal characteristic of the back EMF voltage of the stator with respect to the approximation function $I(\alpha_s)$, and the inductance angle $\alpha_{Ind}$ giving the phase offset of the sinusoidal characteristic of the inductance of the stator with respect to the approximation function $I(\alpha_s)$.

2. The method of claim 1, wherein for a large value A of the amplitude ratio $I_{EMF}/I_{Ind}$ where $A \geq a_1 \gg 1$, the EMF angle $\alpha_{EMF}$ is determined as the rotor position of the rotor.

3. The method of claim 1, wherein for a small value A of the amplitude ratio $I_{EMF}/I_{Ind}$ where $A \leq a_2 \ll 1$, the inductance angle $\alpha_{Ind}$ is determined as the direction of the rotor with a 180° ambiguity.

4. The method of claim 1, wherein for a value A of the amplitude ratio $I_{EMF}/I_{Ind}$, where $a_2 < A < a_1$, and $a_2 \ll 1$ and $a_1 \gg 1$, the rotor position of the rotor is determined from the EMF angle $\alpha_{EMF}$ and/or the inductance angle $\alpha_{Ind}$.

5. The method of claim 4, wherein a value for the rotor position of the rotor is determined from the weighted values of the EMF angle $\alpha_{EMF}$ and the inductance angle $\alpha_{Ind}$, the weighting being performed according to the values of the EMF angle $\alpha_{EMF}$ and the inductance angle $\alpha_{Ind}$.

6. The method of claim 4, wherein the motor-specific phase difference $\alpha_{EMF\_Ind}$ between the EMF angle $\alpha_{EMF}$ and the inductance angle $\alpha_{Ind}$ is determined, and the value for the phase difference $\alpha_{EMF\_Ind}$ is used to check the plausibility of the values for the rotor position of the rotor that are determined from the EMF angle $\alpha_{EMF}$ and/or the inductance angle $\alpha_{Ind}$.

7. The method of claim 1, wherein for a value A of the amplitude ratio $I_{EMF}/I_{Ind}$, where $a_2 < A < a_1$, and $a_2 \ll 1$ and $a_1 \gg 1$, the value of the absolute minimum ($M_1$) of the approximation function $I(\alpha_s)$ is used as the rotor position of the rotor if the motor-specific phase difference $\alpha_{EMF\_Ind}$ between the EMF angle $\alpha_{EMF}$ and the inductance angle $\alpha_{Ind}$ is ascertained to be $+\pi/4$.

8. The method of claim 1, wherein for a value A of the amplitude ratio $I_{EMF}/I_{Ind}$, where $a_2 < A < a_1$, and $a_2 \ll 1$ and $a_1 \gg 1$, the rotor position of the rotor is used as the value of the absolute minimum of the approximation function $I(\alpha_s)$ if the motor-specific phase difference $\alpha_{EMF\_Ind}$ between the EMF angle $\alpha_{EMF}$ and the inductance angle $\alpha_{Ind}$ is ascertained to be $-\pi/4$.

9. The method of claim 1, wherein the inductance angle $\alpha_{Ind}$ in the approximation function $I(\alpha_s)$ is substituted by a subtraction operation between the EMF angle $\alpha_{EMF}$ and the inductance angle $\alpha_{Ind}$ using a difference value $\alpha_{EMF\_Ind}$ ascertained for a specific motor.

10. The method of claim 9, wherein the EMF angle $\alpha_{EMF}$ is determined as the rotor position from the harmonic-wave argument and the first-harmonic argument.

11. The method of claim 1, wherein the approximation function $I(\alpha_s)$ is formed from a superposition of a sinusoidal fundamental wave having the amplitude IEMF and the associated first harmonic having an amplitude IInd as a function of the phase position αs of the test voltage pulses.

* * * * *